(12) United States Patent
Ding et al.

(10) Patent No.: US 7,368,938 B2
(45) Date of Patent: May 6, 2008

(54) INPUT TERMINATION CIRCUITRY WITH HIGH IMPEDANCE AT POWER OFF

(75) Inventors: Xuexin Ding, Shanghai (CN); Hongquan Wang, Shanghai (CN); Weifeng Zhang, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 124 days.

(21) Appl. No.: 11/455,074

(22) Filed: Jun. 15, 2006

(65) Prior Publication Data

US 2007/0290713 A1 Dec. 20, 2007

(51) Int. Cl.
*H03K 17/16* (2006.01)
*H03K 19/003* (2006.01)

(52) U.S. Cl. ............................. 326/30; 326/34; 326/86

(58) Field of Classification Search .................. 326/30, 326/34, 68, 83, 86
See application file for complete search history.

(56) References Cited

U.S. PATENT DOCUMENTS 6,683,473 B2 * 1/2004 Fotouhi ........................ 326/30
2005/0225353 A1 * 10/2005 Kwon .......................... 326/30

* cited by examiner

*Primary Examiner*—Daniel Chang
(74) *Attorney, Agent, or Firm*—Finnegan, Henderson, et al.

(57) ABSTRACT

An input termination circuit includes a first and a second resistor each having a terminal respectively coupled to a first and a second input terminal of the input termination circuit, a first and a second transistor coupled in series between the first resistor and the second resistor, and a third transistor having two terminals respectively coupled to the control circuit and a node between the first and the second transistor. The gate of the third transistor is coupled to ground. The gates of the first and the second transistor are coupled to a control circuit that is adapted to provide a control signal to turn the first and the second transistor on or off.

23 Claims, 5 Drawing Sheets

INPUT TERMINATION CIRCUITRY WITH HIGH IMPEDANCE AT POWER OFF

FIELD OF THE INVENTION

The present invention relates to termination circuitry in communication systems and, in particular, to input termination circuitry with high impedance at power off.

BACKGROUND OF THE INVENTION

More and more people are relying on the Internet to conduct financial transactions, make telephone calls, and perform video conferences. Loss of data could have a devastating effect including loss or delay of critical financial transactions, interference from annoying noises from the telephone lines, or distortion in video clips. To address these problems, redundancy protection may be built into communication systems. One type of redundancy protection that can be utilized at an input terminal for terminating transmission lines of the communication system employs a hardware protection scheme using a primary line interface unit (LIU) card and a secondary or backup LIU card. In the event that there is a primary card failure, data transmission can be switched to the backup card and data transmission can be continued. One type of switching scheme is called hitless protection switching (HPS), where framing synchronization is not lost in the switch between the primary card and the backup card.

The transmission of information over transmission lines also requires an input termination impedance at the receiving side that matches the characteristic impedance of the transmission line. For example, in T1/E1/J1 long haul/short haul communication systems, the impedance matching requires that the termination impedance of the primary card and the backup card be selectable from line terminating impedances 75 Ohm, 100 Ohm, 110 Ohm, or 120 Ohm (T1:100, J1:110, E1:75/120).

In an application such as a HPS, the primary and backup cards are coupled together. In normal operation, the primary card is set to the desired impedance, and the backup card is required to be in a high impedance state whether the power on the backup card is on or off. An exemplary backup card circuit is shown in FIG. 3 (discussed further below). Typically, if the backup card is powered on, high resistance can be achieved by purposefully cutting off the conductive circuit on the backup card. However, when the backup card is powered off (which happens in circumstances such as replacing a LIU card in the system and the like), a low impedance conductive loop may be formed through the backup card (which will be described in detail below), and that low impedance loop may affect the function of the primary card.

Typically, there are two connection modes between the primary card and the backup card. One type of connection is the line connection mode. As shown in FIG. 1, in the line connection mode, a primary card 120 and a backup card 122 are both coupled to the same input line through transformers 124 and 126. The other connection is the pin-pin connection mode. As shown in FIG. 2, in the pin-pin connection mode, backup card 122 and primary card 120 are both coupled to the output terminals of a transformer 128. In either connection mode, a low impedance loop may be formed through the backup card at power off.

FIG. 3 shows a simplified circuit diagram of a traditional input termination circuit 100 that can be used in backup card 122. Input termination circuit 100 can be set to provide high impedance between terminals RTIP (receiver differential tip positive input) and RRING (receiver differential ring negative input) when power is on, and also can be set to provide a low impedance termination during an operational mode, i.e., when circuit 100 becomes a primary card.

As shown in FIG. 3, the input termination circuit 100 includes terminals RTIP and RRING, a common mode voltage (VCM) buffer circuit 102, a termination impedance matching circuit 104, a control circuit 106, and a bias circuit 108. Input termination circuit 100 is coupled to an internal circuit (not shown) (e.g., a device that processes the signals received through input termination circuit 100) through monitor switches 132 and 134.

VCM buffer circuit 102 includes a reference voltage Vref, an amplifier 103, a PMOS (denoted as PM2) and an NMOS (denoted as NM2) coupled in series between a power supply VDD and ground. Vref is coupled to an input of amplifier 103 and transistors PM2 and NM2 having their gates respectively coupled to two outputs of amplifier 103. In some embodiments, Vref can be about 1.5 V. Bias circuit 108 includes two resistors R3 and R4 coupled in series between RTIP and RRING. Resistors R3 and R4 are usually at least about 10K Ohm. When power is on, VCM buffer provides a 1.5 V bias voltage to a node 302 between resistors R3 and R4.

As shown in FIG. 3, control circuit 106 includes two transistors, a PMOS (denoted by PM3) and an NMOS (denoted by NM3) coupled between VDD and ground. Transistors PM3 and NM3 have their gates coupled to a register configuration circuit 107, which may provide a control signal to turn transistors PM3 and NM3 on or off. Termination impedance matching circuit 104 includes a transistor NM1, which can be an NMOS transistor, and two resistors R1 and R2. Resistors R1 and R2 each have a resistance of about half of a line termination resistance, which may be selected from 75 Ohm, 100 Ohm, 110 Ohm, or 120 Ohm depending on the standard. Transistor NM1 is controlled by a control signal CTL generated by control circuit 106 at a node 304 between the two transistors PM3 and NM3 of control circuit 106.

In line connection mode, as shown in FIG. 1, primary card 120 and backup card 122 are respectively coupled to transmission lines through transformers 124 and 126. Backup card 122 may employ input termination circuit 100 as shown in FIG. 3. Transformers 124 and 126 isolate DC signals and couple AC signals to primary card 120 and backup card 122. Typically, primary card 120 is operating and, in backup card 122, control circuit 106 provides a negative control voltage CTL, which turns off transistor NM1. The circuit between RTIP and RRING in circuit 100 has high impedance corresponding to R3 plus R4. However, when backup card 122 is powered off (i.e., VDD on control circuit 106 and VCM buffer circuit 104 is 0 V), the control voltage CTL on the gate of transistor NM1 provided by control circuit 106 has a zero potential. The transient AC signals at terminals RTIP and RRING of the backup card may provide a negative voltage to terminals RTIP and/or RRING. The negative voltage at terminal RTIP or RRING may be clamped by ESD transistors (not shown) coupled to terminals RTIP and RRING to −VD, where VD is the threshold voltage of the ESD transistor. The negative potential is applied to the drain and/or source terminal of transistor NM1 through resistors R1 and/or R2. Because the gate potential is 0 V, transistor NM1 may be turned on by the voltage across the gate and the drain or source terminal. Thus, a low impedance circuit may exist in backup card 122 when the power is off.

In the pin-pin connection mode as shown in FIG. 2, primary card 120 and backup card 122 are coupled to transmission lines through one transformer 128. Terminals RTIP and RRING of backup card 122 are coupled to terminals RTIP and RRING of the primary card 120. Primary card 120 may include a VCM buffer circuit as shown in the circuit in FIG. 3. When primary card 120 is operating, the VCM buffer circuit of primary card 120 provides a DC bias to primary card 120. The DC bias also applies to backup card 122 through terminals RTIP and RRING of backup card 122. When backup card 122 is powered off, a DC current path may be formed through resistors R3 and R4. Another DC current path may also be formed through the monitor switches 132 and 134 and internal circuit coupled to monitor switches 132 and 134. A DC current path may also be formed through a neighboring channel (not shown) which can be coupled to backup card 122 through a monitor switch 136. Those DC current paths may affect the potential on RTIP and RRING of backup card 122, and may make the potential on RTIP and RRING far below Vref. Upon receipt of a full range of AC signals from the transmission lines, potentials at terminals RTIP and RRING may become negative, which may be clamped by the ESD protection circuit to −VD. Transistor NM1 is then turned on and a low impedance differential signal path appears between RTIP and RRING. The low impedance path may affect the function of primary card 120.

Therefore, there is a need for a simple and efficient input termination circuit that presents high impedance at power off and that is applicable for both line connection mode and pin-pin connection mode.

SUMMARY

In accordance with the present invention, an input termination circuit for terminating transmission lines of a communication system may include first and second resistors each having a terminal respectively coupled to first and second input terminals of the input termination circuit, a first and a second transistor coupled in series between the two resistors, and a third transistor having two terminals respectively coupled to the control circuit and a node between the first and the second transistor. The gate of the third transistor may be coupled to ground. The gates of the first and the second transistor may be coupled to a control circuit that is adapted to provide a control signal to turn the first and the second transistor on or off.

In another aspect, an input termination circuit for terminating transmission lines of a communication system may include a first and a second input terminal adapted to be coupled to the transmission lines, a control circuit configured to provide a control voltage at a node of the control circuit, a first and a second resistor each having a terminal respectively coupled to the first and the second input terminal, a first and a second transistor coupled in series between the two resistors, and a third transistor having two terminals respectively coupled to the node for providing the control voltage of the control circuit and a node between the first and the second transistor. The gate of the third transistor may be coupled to ground. The gates of the first and the second transistor may be coupled to the node for providing the control voltage of the control circuit.

It is to be understood that both the foregoing general description and the following detailed description are exemplary and explanatory only and are not restrictive to the invention, as claimed. These and other embodiments are further discussed below with reference to the accompanying drawings, which are incorporated in and constitute a part of this specification.

DETAILED DESCRIPTION

Figure 4:
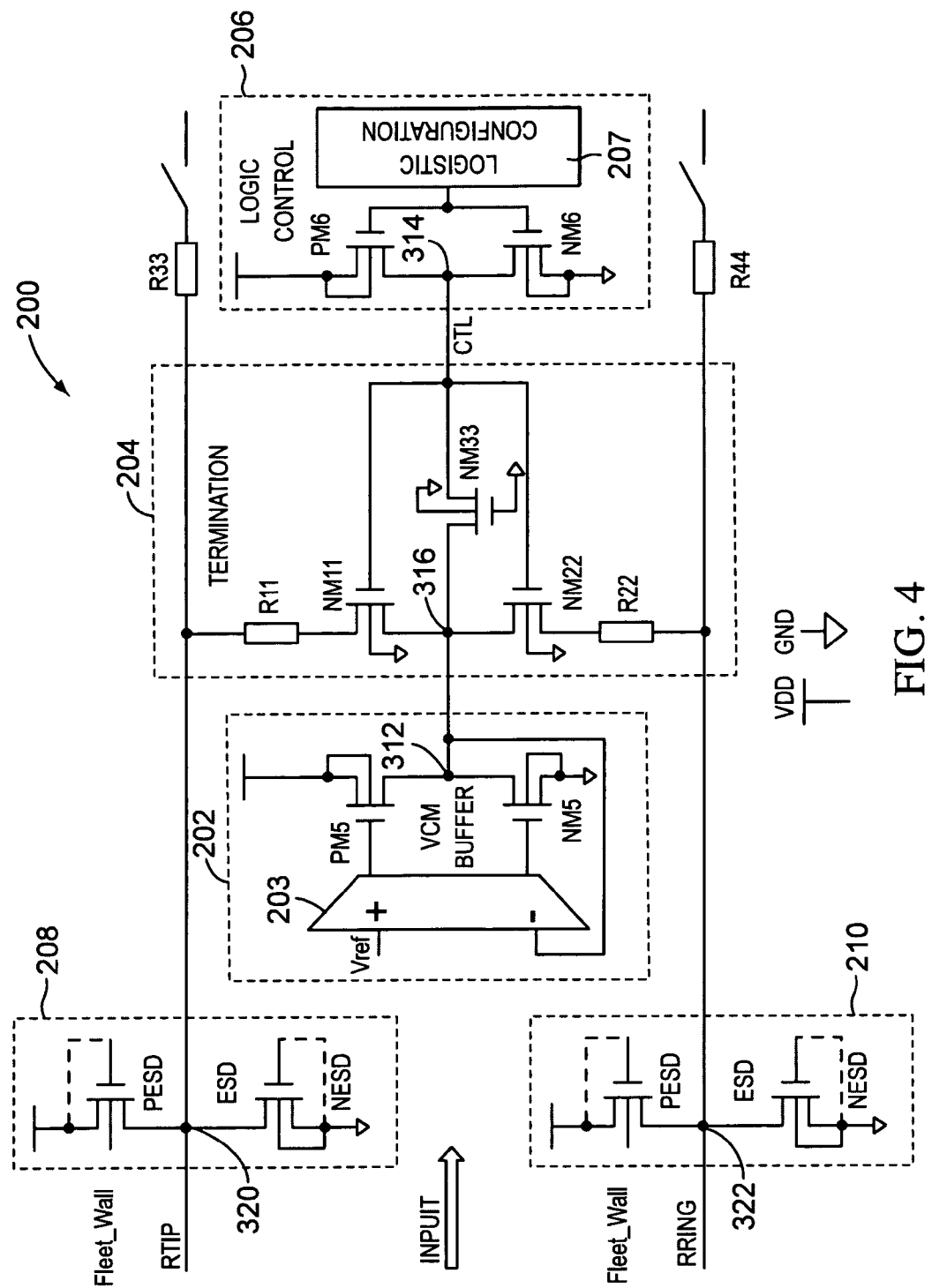
FIG. 4 illustrates a schematic diagram of some embodiments of disclosed input termination circuit according to the present invention.

FIG. 4 illustrates a schematic diagram of an input termination circuit 200 according to some embodiments the present invention. Input termination circuit 200 may be used in a line interface unit (LIU). In the following exemplary embodiments, input termination circuit 200 can be included in a backup LIU (backup card). However, a person skilled in the art should appreciate that input termination circuit 200 also can be used in any LIU, including a primary LIU.

As shown in FIG. 4, in some embodiments input termination circuit 200 may include two terminals RTIP and RRING adapted to be coupled to transmission lines in a communication system. A termination impedance matching circuit 204 can be coupled between the two terminals RTIP and RRING. In some embodiments, input termination circuit 200 may further include a common mode voltage (VCM) buffer circuit 202, a control circuit 206, and ESD protection circuits 208 and 210.

VCM buffer circuit 202 may include a reference voltage Vref, an amplifier 203, and a PMOS transistor (denoted as PM5) and an NMOS transistor (denoted as NM5) coupled in series between a power supply VDD and ground. The voltage Vref is coupled to an input terminal of amplifier 203 and the gates of transistors PM5 and NM5 can be coupled, respectively, to the output terminals of amplifier 203. When the power is on (e.g., VDD=3 V), VCM buffer provides a 1.5 V bias voltage to a node 312 between transistors PM5 and NM5.

Control circuit 206 may include two transistors, a PMOS (denoted by PM6) and an NMOS (denoted by NM6) coupled between VDD and ground. Transistors PM6 and NM6 may have their gates coupled to a register configuration circuit 207, which may provide a control signal to turn transistors PM6 and NM6 on or off. Control circuit 206 generates a control signal (or voltage) CTL at a node 314 between the two transistors PM6 and NM6.

Impedance matching circuit 204 may include resistors R11 and R22, and transistors NM1, NM22, and NM33.

Resistor R11, transistor NM11, transistor NM22, and resistor R22 are coupled in series between terminals RTIP and RRING. The gates of transistors NM11 and NM22 are coupled to node 314 between the two transistors PM6 and NM6. One terminal of transistor NM33 may be coupled to a node 316 between transistors NM11 and NM22, and the other terminal of transistor NM33 may be coupled to node 314. Node 316 is coupled to node 312. The gate of transistor NM33 may be coupled to ground. Resistors R11 and R22 are about half of the characteristic impedance of the transmission lines. For example, in T1/E1/J1 long haul/short haul communication systems, impedance matching can be accomplished when the termination impedance of the primary card and the backup card is selectable, in some embodiments, from line terminating impedance 75 Ohm, 100 Ohm, 110 Ohm, or 120 Ohm (T1:100, J1:110, E1:75/120). Thus, in T1 mode, in some embodiments resistors R11 and R22 each may have a set resistance, for example of about 50 Ohm. Resistors R11 and R22 may be programmable or adjustable to set a desirable impedance value for a particular situation. Impedance matching circuit 204 may be coupled to node 312 of VCM buffer circuit 202.

Each of ESD protection circuits 208 and 210 may include a PMOS transistor PESD and an NMOS transistor NESD coupled between VDD and ground, and terminal RTIP/RRING is coupled to a node 320/322 between transistors PESD and NESD, as shown in FIG. 4. The gate of transistor PESD can be coupled to VDD and the gate of transistor NESD can be coupled to ground.

Input termination circuit 200 may further include resistors R33 and R44, respectively coupled to terminals RTIP and RRING as shown in FIG. 4. Resistors R33 and R44 each may have a resistance value of about 500 Ohm.

Input termination circuit 200 may provide a low impedance termination between terminals RTIP and RRING during an operational mode, i.e., when circuit 200 is operating as a primary card. In the operational mode, VDD is greater than 0 V (e.g., 3 V), and CTL is positive. Transistors NM11 and NM22 are both turned on, and transistor NM33 is off. A low termination impedance (R11+R22) is established between terminals RTIP and RRING, which may match the characteristic impedance of transmission lines. In a non-operational mode (i.e., another card is used as a primary card, and input termination circuit 200 is operating as a backup only) and if power is on, control circuit 206 may be set to provide a negative signal to turn transistors NM11 and NM22 off, hand thus high impedance is established between terminals RTIP and RRING of input termination circuit 200. As will be described below, input termination circuit 200 can also provide high impedance when input termination circuit 200 is powered off in either a line connection mode or a pin-pin connection mode.

Figure 1:
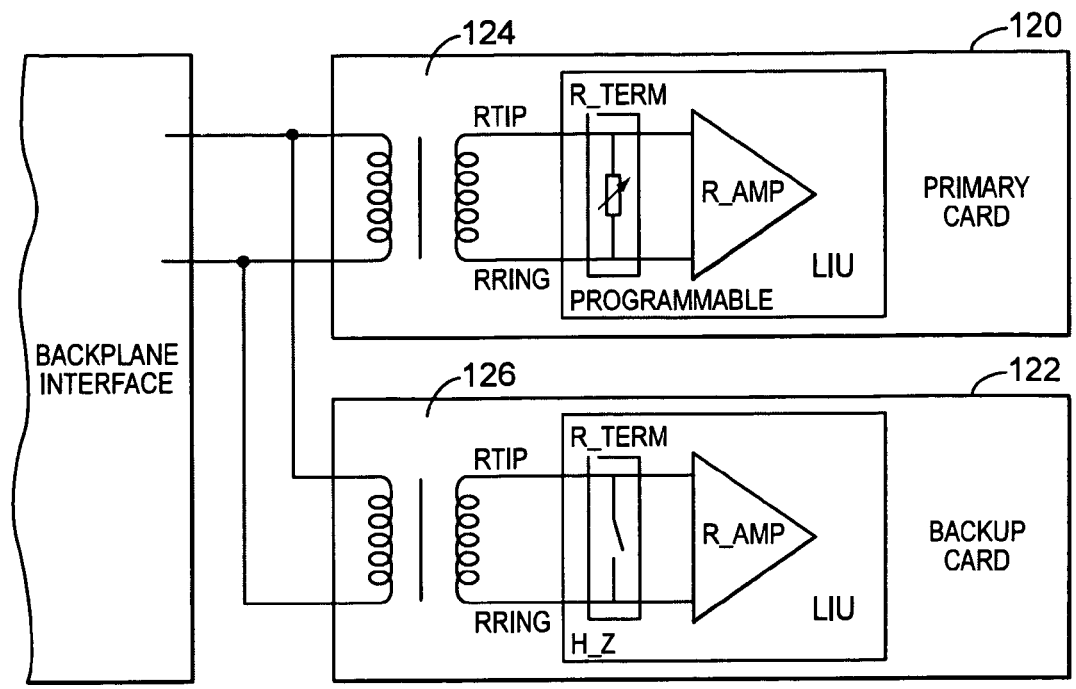
FIG. 1 illustrates a schematic diagram of a conventional communication system showing a line connection mode between a primary line interface unit (LIU) card and a backup LIU card.

In a line connection mode as shown in FIG. 1, when the backup card is powered off (e.g., VDD=0 V), and because transformer 126 isolates any DC signals from backup card 122, DC voltage on terminals RTIP and RRING of input termination circuit 200 is 0 V. The transient AC signal may provide terminal RTIP or RRING with a negative potential, which may be clamped by ESD transistors of ESD circuits 208 and 210 to −VD potential, where VD is the threshold voltage of the ESD transistor. For example, if RTIP is negative, because CTL has 0 V potential, the voltage across the gate and the drain or source of transistor NM11 may become sufficient to turn transistor NM11 on. When transistor NM11 is on, node 316 is charged with a negative potential by NM11. The negative potential at node 316 may turn transistor NM33 on, and node 314 is charged with the same negative potential by transistor NM33. After the potential at node 314 becomes negative, transistors NM11 and NM22 may both be turned off, and high impedance is provided between terminals RTIP and RRING. Because circuit 200 is symmetrical, if terminal RRING is negative, transistors NM11 and NM22 will also be off. Therefore, backup card 122 (which includes input termination circuit 200) may always have high impedance between terminals RTIP and RRING during power off.

Figure 2:
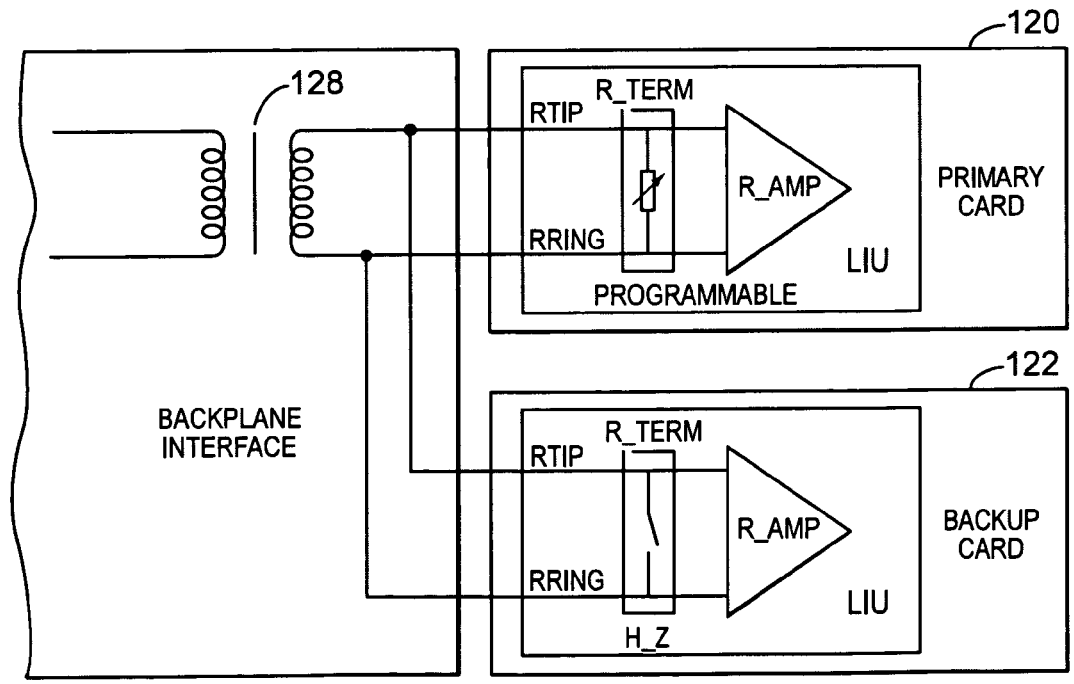
FIG. 2 illustrates a schematic diagram of a conventional communication system showing a pin-pin connection mode between a primary line interface unit (LIU) card and a backup LIU card.
Figure 3:
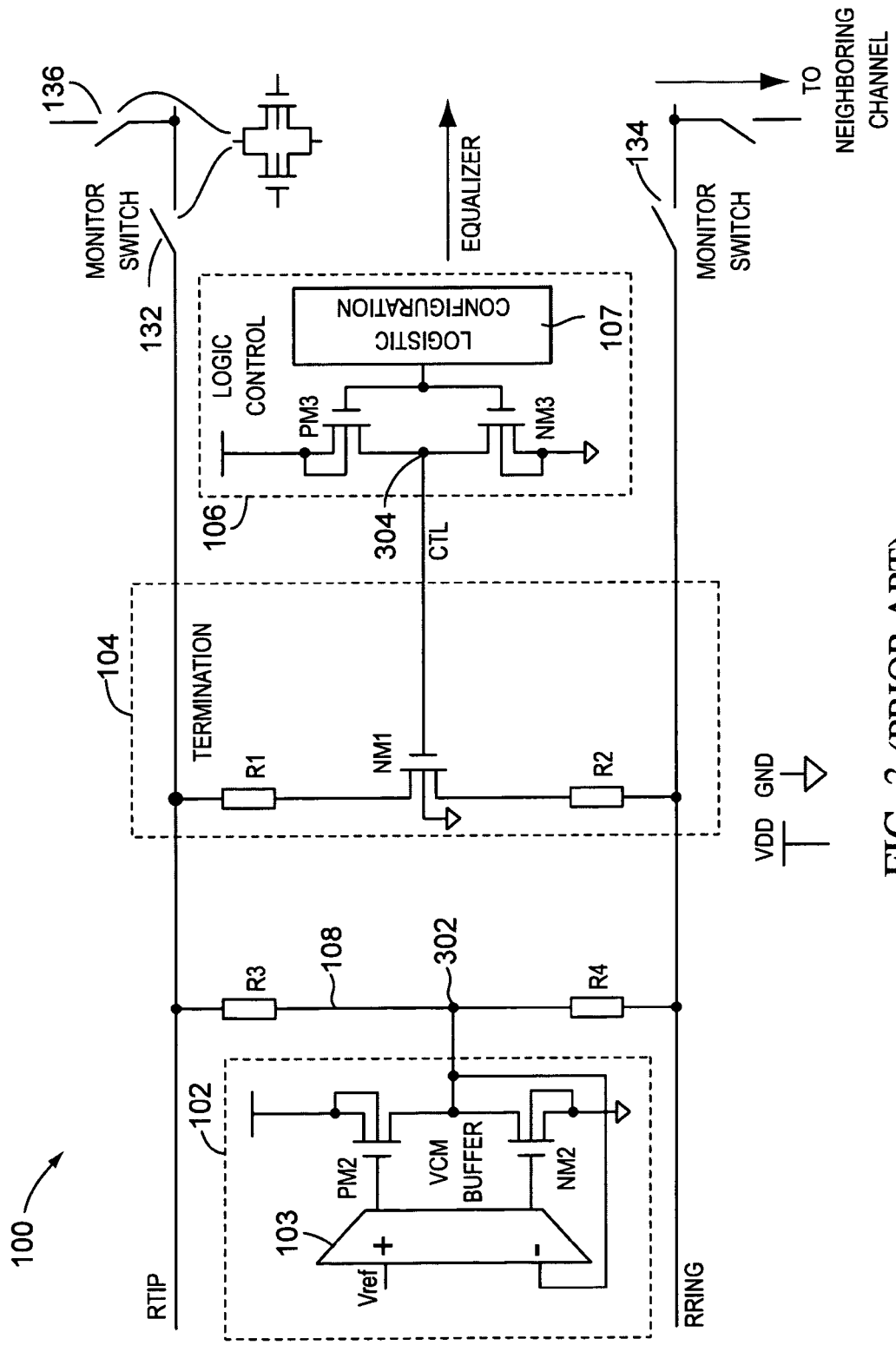
FIG. 3 illustrates a schematic diagram of a conventional input termination circuit.

In a pin-pin connection mode as shown in FIG. 2, terminals RTIP and RRING of the backup card may be coupled to terminals RTIP and RRING of the primary card. When the primary card is in operation, VCM buffer may provide a 1.5 V bias to terminals RTIP and RRING on the primary card. Such DC bias is also directly coupled to terminals RTIP and RRING of the backup card (which employs input termination circuit 200 as shown in FIG. 4). While the signals coupled to terminals RTIP and RRING swings between 0 V and 3 V, and node 316 and node 314 are both at 0 V, transistors NM11, NM22, and NM33 are all turned off. If transistor NM11 or NM22 is turned on by an abnormal negative voltage that appears on one of the terminals of the transistors, transistor NM33 may also be turned on. That will bring node 314 to a negative potential, which in turn, turns off both transistors NM11 and NM22. Thereby, transistors NM11 and NM22 will always be off, and the backup card (which employs input termination circuit 200 thereon) may always in a high differential mode impedance state and a high common mode impedance state.

Figure 5:
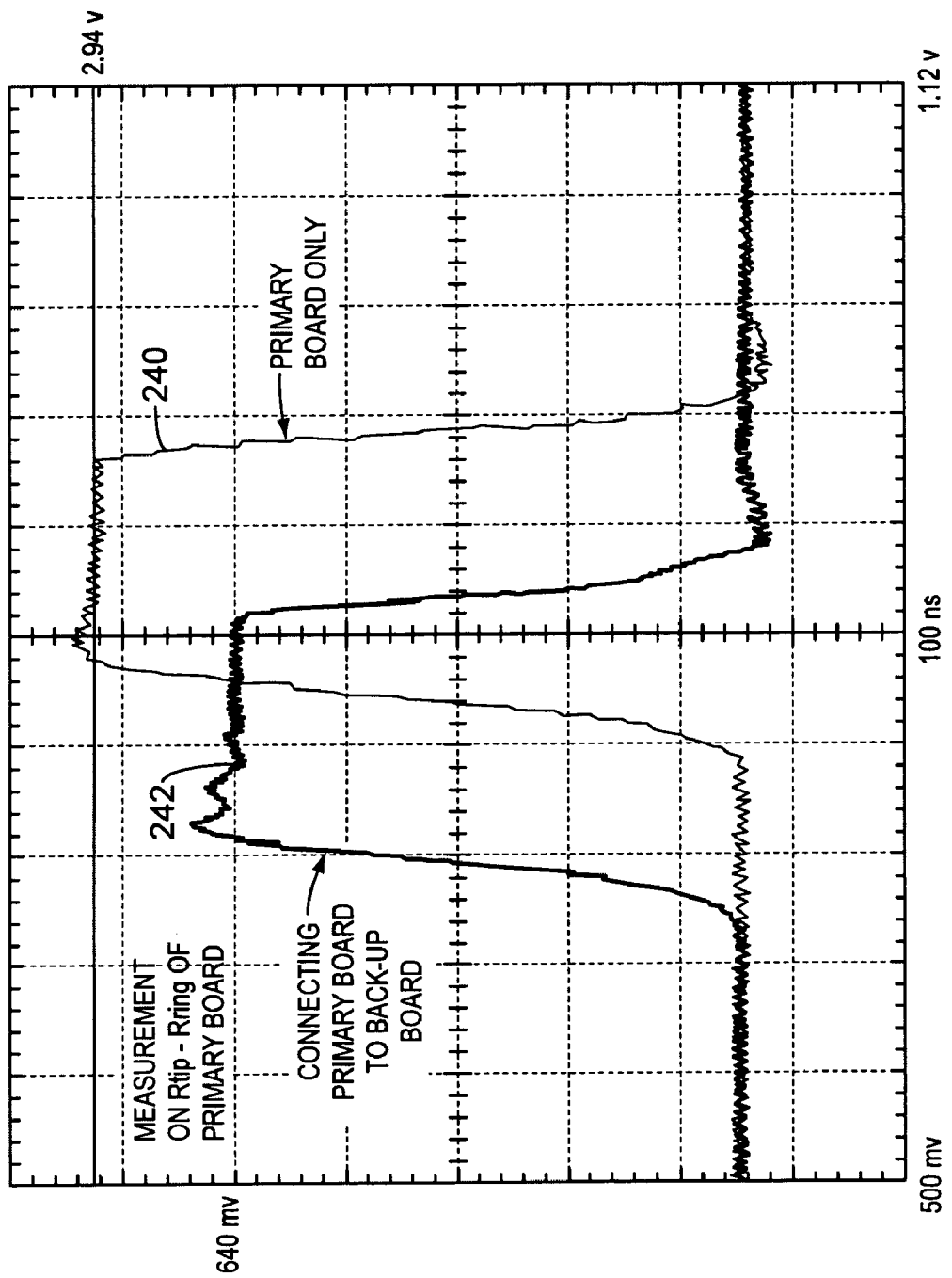
FIG. 5 illustrates waveforms of test results of a single primary card in comparison with a primary card coupled with a backup card having an input termination circuit without high impedance at power off.
Figure 6:
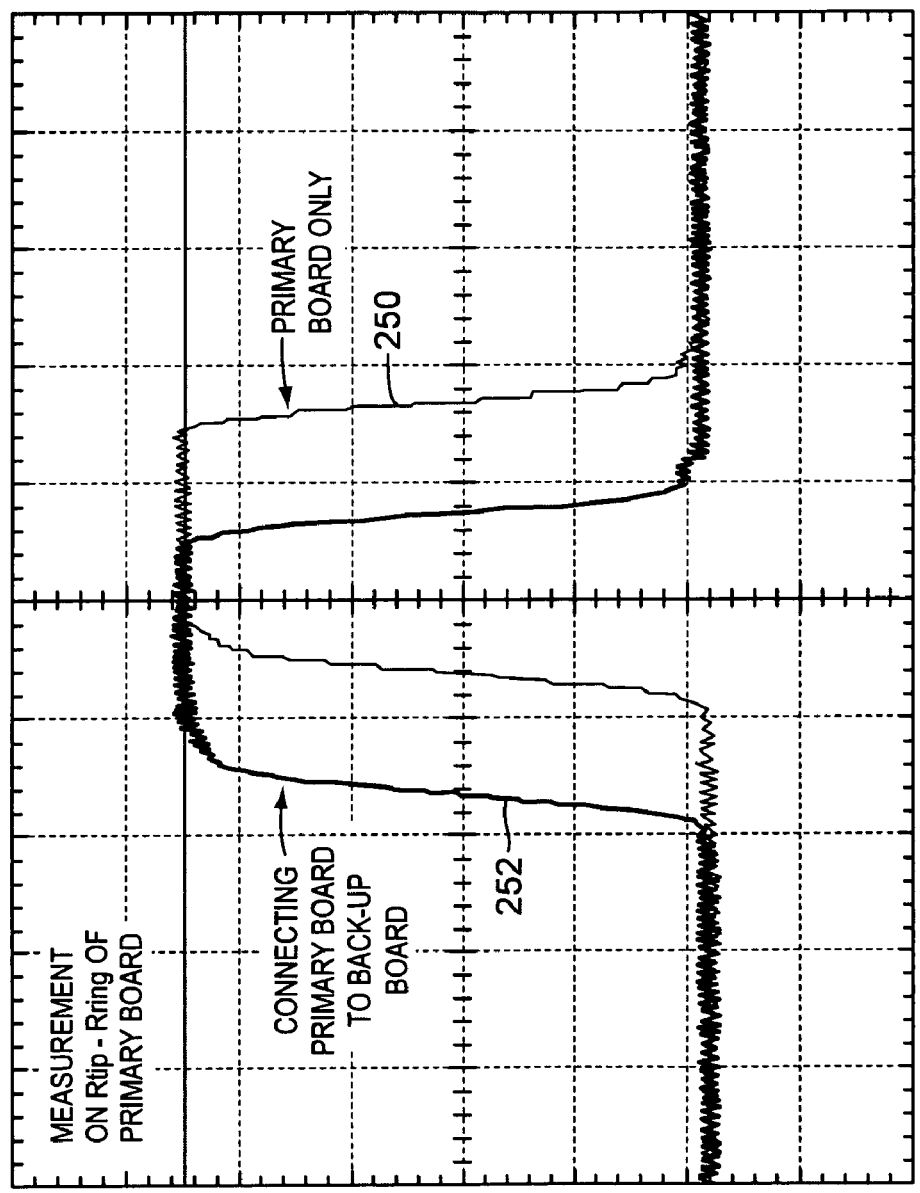
FIG. 6 illustrates waveforms of test results of a single primary card in comparison with a primary card coupled with a backup card having an exemplary disclosed input termination circuit according to the present disclosure.

FIGS. 5 and 6 show waveforms of test results of different input termination circuits. In the test, the primary card is powered on and the backup card is powered off. A T1/E1 equipment is used to generate test signals. In FIG. 5, waveform 240 indicates a signal at terminal RTIP or RRING of a primary card without connecting a backup card, and waveform 242 indicates a signal at terminal RTIP or RRING of the primary card coupled to a backup card, which does not have high resistance at power off. As seen in FIG. 5, a substantial signal loss can be observed if the backup card does not have high resistance at power off.

In FIG. 6, waveform 250 indicates a signal at terminal RTIP or RRING of a primary card without being coupled to a backup card, and waveform 252 indicates a signal at terminal RTIP or RRING of the primary card coupled to a backup card having an input termination circuit constructed according to the present disclosure. As seen in FIG. 6, there is almost no signal loss at the terminals RTIP and RRING of the primary card, when the backup card is powered off.

It will be apparent to those skilled in the art that various modifications and variations can be made to the input termination circuitry with high impedance at power off. Other embodiments will be apparent to those skilled in the art from consideration of the specification and practice of the disclosed input termination circuitry with high impedance at power off. It is intended that the specification and examples be considered as exemplary only, with a true scope being indicated by the following claims and their equivalents.

What is claimed is:

1. An input termination circuit for terminating transmission lines of a communication system, comprising:
   a first and a second resistor, each having a terminal respectively coupled to a first and second input terminal of the input termination circuit;
   a first and a second transistor coupled in series between the first resistor and the second resistor, the gates of the first and the second transistor being coupled to a control circuit; and a third transistor having two terminals respectively coupled to the control circuit and a node between the first and the second transistor, wherein the gate of the third transistor is coupled to ground.

2. The input termination circuit according to claim 1, wherein the first and the second transistor are CMOS transistors.

3. The input termination circuit according to claim 1, wherein the third transistor is a CMOS transistor.

4. The input termination circuit according to claim 1, wherein the first and the second transistor are NMOS transistors.

5. The input termination circuit according to claim 1, wherein the first and the second transistor are PMOS transistors.

6. The input termination circuit according to claim 1, wherein the control circuit is configured to provide a control voltage to the gates of the first and the second transistor when the control circuit is powered on.

7. The input termination circuit according to claim 6, wherein the control circuit includes a PMOS transistor and an NMOS transistor coupled in series between a power supply and ground.

8. The input termination circuit according to claim 1 further comprising a buffer circuit configured to provide a reference voltage at the node between the first and the second transistor.

9. The input termination circuit according to claim 8, wherein the buffer circuit includes a PMOS transistor and an NMOS transistor coupled in series between a power supply and ground.

10. The input termination circuit according to claim 1, wherein the first and the second resistor each have a resistance value of about half of a termination resistance that matches characteristic impedance of transmission lines, which the input termination circuit is adapted to be coupled to.

11. The input termination circuit according to claim 1, wherein the first and the second resistor have resistance value of about half of a termination resistance, which is selected from a group consisting of 75 Ohm, 100 Ohm, 110 Ohm, and 120 Ohm.

12. The input termination circuit according to claim 1, wherein the resistance of the first and the second resistor is programmable.

13. The input termination circuit according to claim 1 further comprising a third and a fourth resistor respectively coupled to a first and a second input terminal of the input termination circuit, wherein the third and the fourth resistor each have an impedance value of about and over 500 Ohm.

14. The input termination circuit according to claim 1 further comprising two electrostatic discharge (ESD) protection circuits respectively coupled to the first and the second input terminal of the input termination circuit.

15. An input termination circuit for terminating transmission lines of a communication system, comprising:

a first and a second input terminal adapted to be coupled to the transmission lines;

a control circuit configured to provide a control voltage at a node of the control circuit;

a first and a second resistor each having a terminal respectively coupled to the first and the second input terminal;

a first and a second transistor coupled in series between the first resistor and the second resistor, the gates of the two transistors being coupled to the node for providing the control voltage; and a third transistor having two terminals respectively coupled to the node for providing the control voltage of the control circuit and a node between the first and the second transistor, wherein the gate of the third transistor is coupled to ground.

16. The input termination circuit according to claim 1 further comprising a buffer circuit configured to provide a reference voltage at the node between the first and the second transistor.

17. The input termination circuit according to claim 16, wherein the buffer circuit includes a PMOS transistor and an NMOS transistor coupled in series between a power supply and ground.

18. The input termination circuit according to claim 15, wherein the control circuit includes a PMOS transistor and an NMOS transistor coupled in series between a power supply and ground.

19. The input termination circuit according to claim 15, wherein the first and the second resistor each have a resistance value of about half of a termination resistance that matches the characteristic impedance of transmission lines, which the input termination circuit is adapted to be coupled to.

20. The input termination circuit according to claim 15, wherein the first and the second resistor each have a resistance value of about half of a termination resistance, which is selected from a group consisting of 75 Ohm, 100 Ohm, 110 Ohm, and 120 Ohm.

21. The input termination circuit according to claim 15, wherein the resistance of the first and the second resistor is programmable.

22. The input termination circuit according to claim 15 further comprising a third and a fourth resistor respectively coupled to the first and the second input terminal of the input termination circuit, wherein the third and the fourth resistor each have a resistance value of about 500 Ohm.

23. The input termination circuit according to claim 15 further comprising two electrostatic discharge (ESD) protection circuits respectively coupled to the first and the second input terminal of the input termination circuit.

* * * * *